(12) United States Patent
Kim et al.

(10) Patent No.: US 9,240,234 B2
(45) Date of Patent: Jan. 19, 2016

(54) METHOD OF OPERATING CHANNEL BUFFER BLOCK AND DEVICES INCLUDING THE CHANNEL BUFFER BLOCK

(71) Applicant: SAMSUNG ELECTRONICS CO., LTD., Suwon-si, Gyeonggi-do (KR)

(72) Inventors: Kyung Chun Kim, Yongin-si (KR); Hyun Sang Park, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/581,792

(22) Filed: Dec. 23, 2014

(65) Prior Publication Data
US 2015/0357998 A1  Dec. 10, 2015

(30) Foreign Application Priority Data
Jun. 10, 2014  (KR) .......................... 10-2014-0069901

(51) Int. Cl.
| | |
|---|---|
| G11C 11/419 | (2006.01) |
| H04N 5/335 | (2011.01) |
| H04N 5/225 | (2006.01) |
| G05F 3/30 | (2006.01) |
| H01L 29/78 | (2006.01) |
| G05F 3/02 | (2006.01) |
| G05F 3/16 | (2006.01) |
| H03M 1/06 | (2006.01) |

(52) U.S. Cl.
CPC ............... *G11C 11/419* (2013.01); *G05F 3/30* (2013.01); *H01L 29/7801* (2013.01); *H04N 5/225* (2013.01); *H04N 5/335* (2013.01); *G05F 3/02* (2013.01); *G05F 3/16* (2013.01); *H03M 1/06* (2013.01)

(58) Field of Classification Search
CPC ............... G05F 3/02; G05F 3/16; G05F 3/30; G11C 11/419; H01L 29/7801; H01L 27/14612; H04N 5/335; H04N 5/225; H03M 1/06
USPC .......................................... 365/154; 327/536
See application file for complete search history.

(56) References Cited

U.S. PATENT DOCUMENTS

| | | | |
|---|---|---|---|
| 5,883,535 A | 3/1999 | Kato | |
| 7,242,332 B1* | 7/2007 | Boemler | H03M 1/0604 250/208.1 |
| 7,652,538 B2 | 1/2010 | Choi | |
| 7,760,199 B2 | 7/2010 | An | |
| 7,808,468 B2 | 10/2010 | Son et al. | |
| 7,898,449 B2 | 3/2011 | Kawahito et al. | |
| 2005/0218299 A1* | 10/2005 | Olsen | H03F 3/08 250/214 A |
| 2007/0045514 A1* | 3/2007 | McKee | H01L 27/14603 250/208.1 |
| 2007/0296456 A1* | 12/2007 | van der Goes | H03K 19/0005 326/30 |
| 2008/0074524 A1* | 3/2008 | Panicacci | H01L 27/14609 348/308 |
| 2009/0053848 A1* | 2/2009 | Fan | H01L 27/14603 438/59 |

(Continued)

FOREIGN PATENT DOCUMENTS

| | | |
|---|---|---|
| JP | 2010-147830 | 7/2010 |
| JP | 2010-109848 | 6/2012 |

*Primary Examiner* — Nathan Ha
(74) *Attorney, Agent, or Firm* — F. Chau & Associates, LLC

(57) ABSTRACT

A method of operating a channel buffer block is provided. The method includes changing bias voltages applied to bias lines in an input stage included in the channel buffer block using a coupling effect of coupling capacitors during a slewing interval and increasing bias currents in the input stage using input voltages and changed bias voltages.

16 Claims, 13 Drawing Sheets

(56) References Cited

U.S. PATENT DOCUMENTS

| | | | |
|---|---|---|---|
| 2009/0127437 A1* | 5/2009 | Li | H01L 27/14609 250/208.1 |
| 2009/0160981 A1* | 6/2009 | Baumgartner | H01L 27/14603 348/274 |
| 2010/0033464 A1 | 2/2010 | Shimatani | |
| 2010/0243866 A1* | 9/2010 | Mo | H03F 3/08 250/214 A |
| 2011/0074507 A1* | 3/2011 | Tsuzaki | H03F 3/3022 330/253 |
| 2011/0279438 A1 | 11/2011 | Ito | |
| 2012/0002573 A1* | 1/2012 | Ceekala | H04L 5/1461 370/276 |
| 2015/0244355 A1* | 8/2015 | Venkiteswaran | H03M 1/38 341/161 |

* cited by examiner

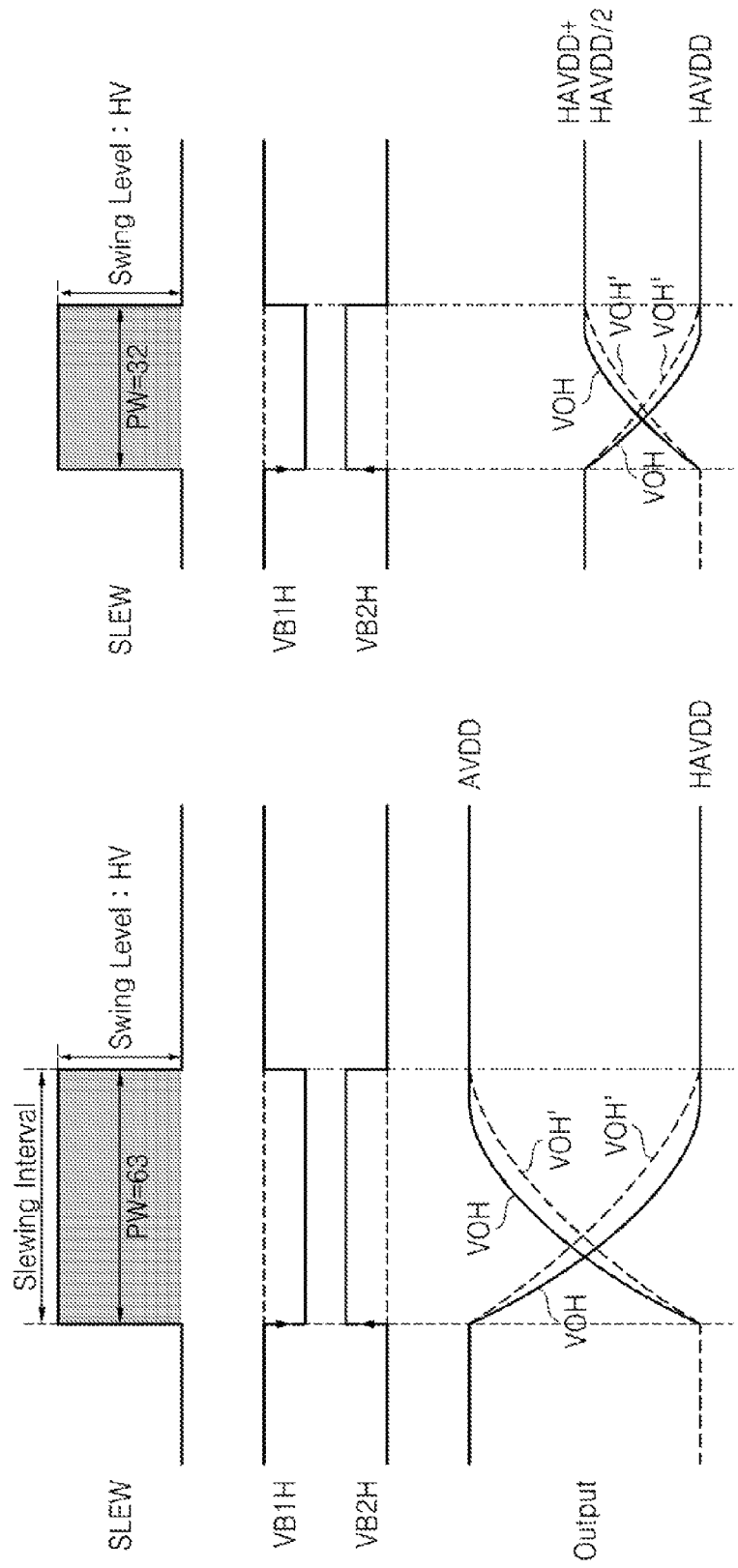

METHOD OF OPERATING CHANNEL BUFFER BLOCK AND DEVICES INCLUDING THE CHANNEL BUFFER BLOCK

CROSS-REFERENCE TO RELATED APPLICATION

This application claims under 35 U.S.C. §119(a) priority to and the benefit of Korean Patent Application No. 10-2014-0069901 filed on Jun. 10, 2014, the entire content of which is incorporated by reference herein.

BACKGROUND

The present disclosure relates to devices having a channel buffer block, and more particularly, to a method of operating a channel buffer block which provides an output voltage having a high slew rate without increasing standby current and devices including the channel buffer block.

Demand for a low-power, high-resolution portable display is increasing and a display driver circuit with high-speed and high-precision is needed to drive such portable display. When the resolution of a display having a certain size is increased, the time for charging pixels in a display panel of the display is decreased, and therefore, a display driver circuit having a high slew rate is needed.

The slew rate is defined as the maximum rate of change of output voltage per unit of time. When the slew rate of a display driver circuit increases, the standby current of the display driver circuit also increases. Accordingly, a display driver having a high slew rate consumes a significant amount of power. When a display driver having a high slew rate is used for a portable electronic device, such as a smart phone or a table personal computer (PC) which uses a battery, the portable electronic device consumes a significant amount of power. Therefore, a portable electronic device is needed that can meet both high slew rate and low-power consumption.

SUMMARY

Exemplary embodiments of the inventive concepts provide a column driver integrated circuit (IC) having a high slew rate without increasing standby current and chip size, and devices including the same.

According to exemplary embodiments of the inventive concepts, there is provided a method of operating a channel buffer block. The method includes changing bias voltages applied to bias lines in an input stage included in the channel buffer block using a coupling effect of coupling capacitors during a slewing interval and increasing bias currents in the input stage using input voltages and changed bias voltages.

The changing the bias voltages may include changing the bias voltages using a coupling pulse signal input from an outside of the channel buffer block to the coupling capacitors. A pulse width of the coupling pulse signal may be adjusted. Alternatively, the changing the bias voltages may include changing the bias voltages using voltages of internal nodes in the input stage, which are input to the coupling capacitors for self-boosting.

According to other exemplary embodiments of the inventive concepts, there is provided a column driver IC having a channel buffer block. The channel buffer block includes a first differential amplifier, a second differential amplifier, a first coupling capacitor, and a second coupling capacitor.

The first differential amplifier includes a first bias circuit configured to generate a first bias current inversely proportional to a first bias voltage and a first transistor pair configured to amplify a difference between input voltages using the first bias current. The second differential amplifier includes a second bias circuit configured to generate a second bias current proportional to a second bias voltage and a second transistor pair configured to amplify the difference between the input voltages using the second bias current. The first coupling capacitor decreases the first bias voltage using a first control voltage during a slewing interval. The second coupling capacitor increases the second bias voltage using a second control voltage during the slewing interval.

The first control voltage and the second control voltage may be received from outside of the channel buffer block and a phase of the first control voltage may be opposite to a phase of the second control voltage during the slewing interval. The column driver IC may further include a pulse width control circuit configured to control a pulse width of the first control voltage using a control code output from a timing controller.

Alternatively, the first control voltage may be a voltage of a first common node of the first bias circuit and the first transistor pair and the second control voltage may be a voltage of a second common node of the second bias circuit and the second transistor pair. The voltage of the first common node may decrease when one of the input voltages decreases and the voltage of the second common node may increase when the one of the input voltages increases.

According to other exemplary embodiments of the inventive concepts, there is provided a display system including the above-described column driver IC and a timing controller configured to control operation of the column driver IC.

The first control voltage and the second control voltage may be received from an outside of the channel buffer block and a phase of the first control voltage may be opposite to a phase of the second control voltage during the slewing interval. The column driver IC may further include a pulse width control circuit configured to control a pulse width of the first control voltage using a control code output from a timing controller.

The timing controller may compare previous line data in display data with current line data in the display data and generate the control code according to a comparison result.

The display system may further include a serial interface connected between the column driver IC and the timing controller. The timing controller may generate a data packet having the display data and the control code and may transmit the data packet to the column driver IC through the serial interface.

According to further exemplary embodiments of the inventive concepts, there is provided an image processing system including a column driver IC having a channel buffer block, a timing controller configured to control operation of the column driver IC, and a processor configured to control operation of the timing controller. The channel buffer block includes a first differential amplifier having a first bias circuit configured to generate a first bias current inversely proportional to a first bias voltage and a first transistor pair configured to amplify a difference between input voltages using the first bias current, a second differential amplifier having a second bias circuit configured to generate a second bias current proportional to a second bias voltage and a second transistor pair configured to amplify the difference between the input voltages using the second bias current, a first coupling capacitor configured to decrease the first bias voltage using a first control voltage during a slewing interval, and a second coupling capacitor configured to increase the second bias voltage using a second control voltage during the slewing interval.

BRIEF DESCRIPTION OF THE DRAWINGS

The above and other features and advantages of the inventive concepts will become more apparent by describing in detail exemplary embodiments thereof with reference to the attached drawings in which:

FIGS. 6A and 6B are waveform diagrams of the output signals of a pulse width control circuit and a channel buffer block illustrated in FIG. 2;

DETAILED DESCRIPTION OF THE EMBODIMENTS

Figure 1:
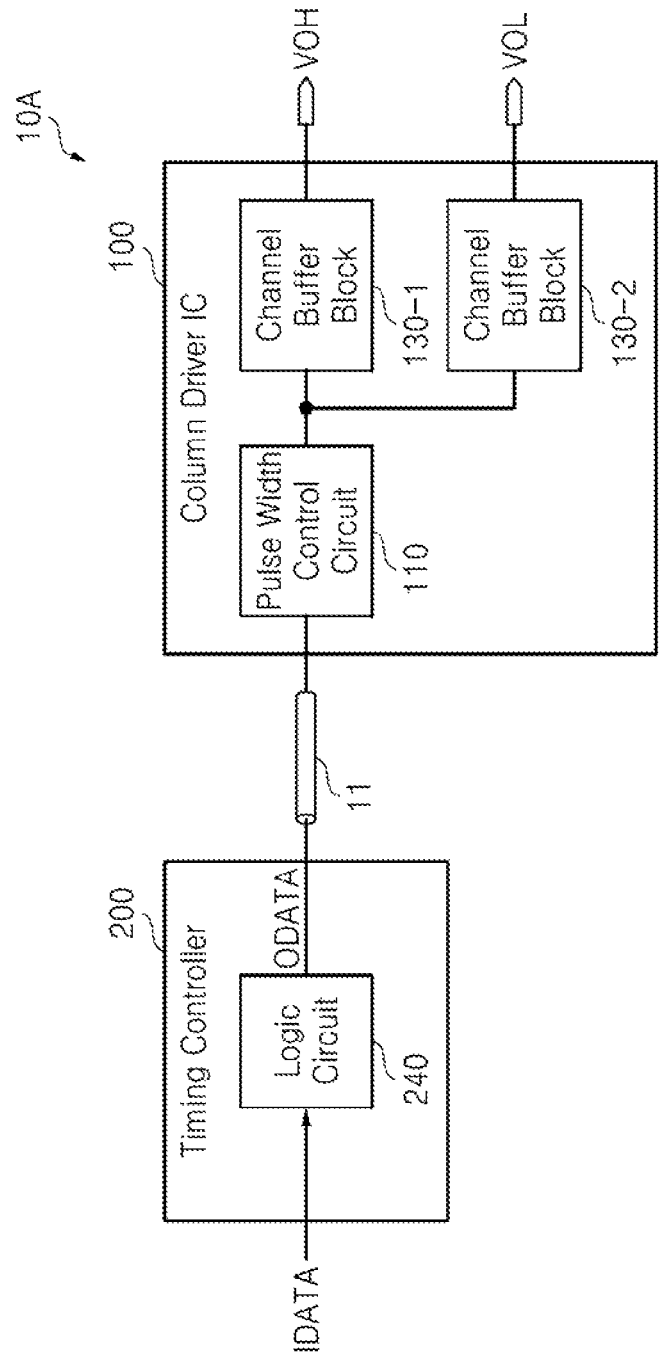
FIG. 1 is a block diagram of a display system including a timing controller and a column driver integrated circuit (IC) according to an exemplary embodiment of the inventive concepts.

The inventive concepts will now be described more fully hereinafter with reference to the accompanying drawings, in which exemplary embodiments of the present inventive concepts are shown. The present inventive concepts may, however, be embodied in many different forms and should not be construed as limited to the embodiments set forth herein. Rather, these embodiments are provided so that this disclosure will be thorough and complete, and will fully convey the scope of the present inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by those of ordinary skill in the art to which the present inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a display system 10A including a timing controller 200 and a column driver integrated circuit (IC) 100 according to an exemplary embodiment of the inventive concepts. Referring to FIG. 1. the display system 10A may include a timing controller 200, a serial interface 11, and a column driver IC 100. The display system 10A may be implemented as a television (TV), a digital TV (DTV), or a portable electronic device. The portable electronic device may be a laptop computer, a smart phone, a table personal computer (PC), a mobile internet device (MID), a wearable computer, an internet of things (IoT) device, or an internet of everything (IoE) device.

The timing controller 200 may control operations of the column driver IC 100 through the serial interface 11. For example, the serial interface 11 may be implemented as an enhanced reduced voltage differential signaling (eRVDS) interface or a mobile industry processor interface (MIPI®). (MIPI® is a registered service mark of MIPI Alliance, Inc.) The timing controller 200 may compare previous line data of display data IDATA with current line data of the display data IDATA and may transmit a control code (e.g., output data ODATA including configuration control code CSPW[5:0] shown in FIG. 4 and pixel data (e.g., PDATA in FIG. 4) for controlling a pulse width of a coupling pulse signal to the column driver IC 100 through the serial interface 11 according to the comparison result. For example, the output data ODATA may have a form of a data packet illustrated in FIG. 4.

The structure and the operations of the timing controller 200 including a logic circuit 240 will be described in more detail hereinafter with reference to FIG. 3.

The column driver IC 100, which may be implemented in an IC chip, may include a pulse width control circuit 110, a first channel buffer block 130-1, and a second channel buffer block 130-2. Although two channel buffer blocks 130-1, 130-2 are illustrated in FIG. 1 for clarity of the description, the inventive concepts are not limited to the number of channel buffer blocks.

The pulse width control circuit 110 may analyze the control code included in the output data ODATA received through the serial interface 11, may adjust the pulse width of a coupling pulse signal according to the analysis result, and may generate a pulse-width adjusted coupling pulse signal.

The first channel buffer block 130-1 may change the bias voltages of bias lines in an input stage using coupling capacitors that receive the pulse-width adjusted coupling pulse signal only during a slewing interval. The bias currents of the input stage increase when the bias voltages change due to a coupling effect, and therefore, a slew rate also increases. Accordingly, the first channel buffer block 130-1 may output a first output voltage VOH having an increased slew rate only during the slewing interval.

The second channel buffer block 130-2 may change the bias voltages of bias lines in an input stage using coupling capacitors that receive the pulse-width adjusted coupling pulse signal only during a slewing interval. The bias currents of the input stage increase when the bias voltages change due to a coupling effect, and therefore, a slew rate also increases. Accordingly, the second channel buffer block 130-2 may output a second output voltage VOL having an increased slew rate only during the slewing interval.

Figure 2:
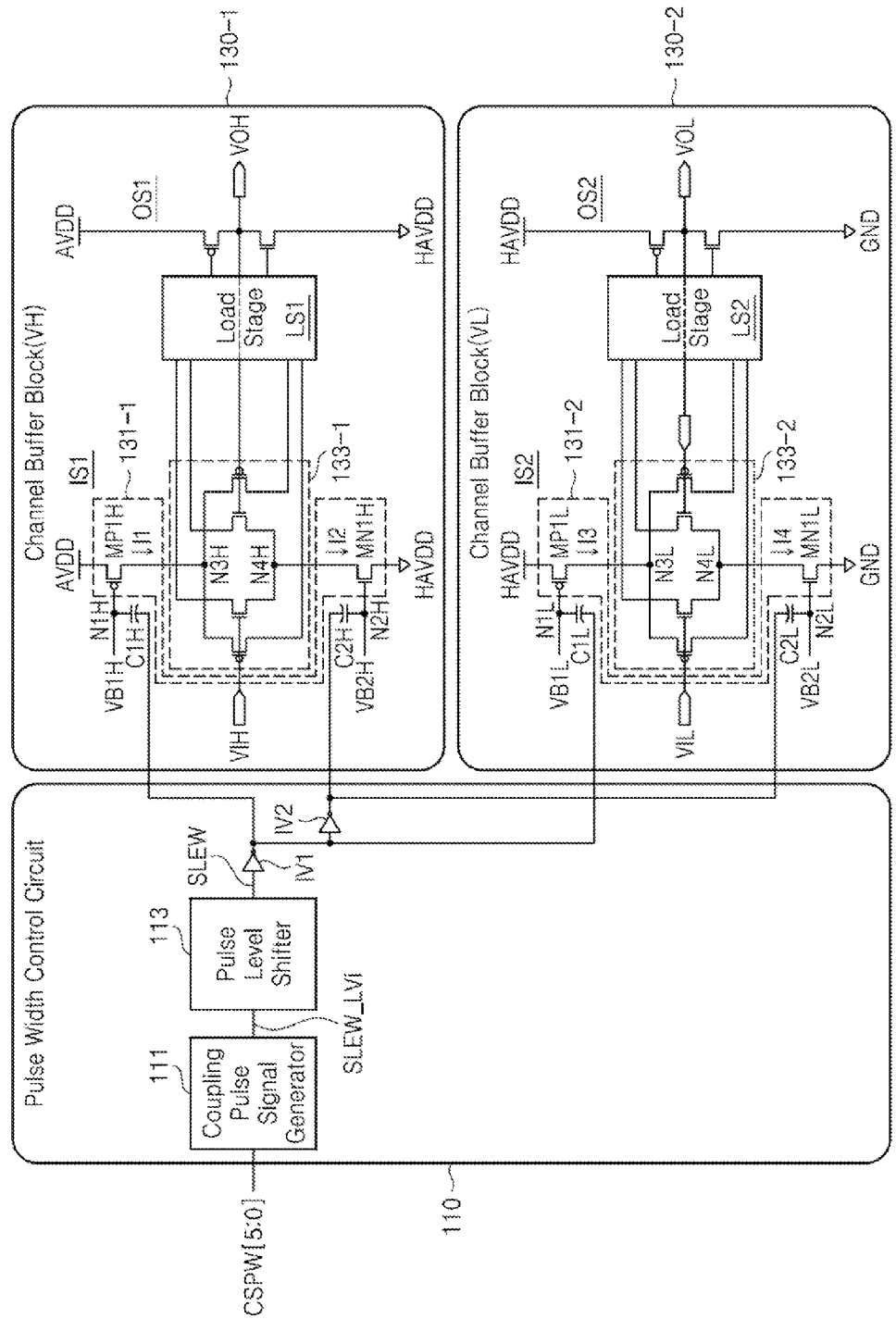
FIG. 2 is a block diagram of the column driver IC illustrated in FIG. 1 according to an exemplary embodiment of the inventive concepts.

FIG. 2 is a block diagram of the column driver IC 100 illustrated in FIG. 1 according to an exemplary embodiment of the inventive concepts. Referring to FIG. 2, a column driver IC 100 may include a pulse width control circuit 110, a first channel buffer block 130-1, and a second channel buffer block 130-2. Although two channel buffer blocks 130-1, 130-2 are illustrated in FIG. 2 for clarity of the description, the inventive concepts are not limited thereto.

The pulse width control circuit 110 includes a coupling pulse signal generator 111, a pulse level shifter 113, and a plurality of inverters IV1, IV2. The coupling pulse signal generator 111 may generate a pulse-width adjusted coupling pulse signal (hereinafter, referred to as a first coupling pulse signal) SLEW_LVi in response to a control code CSPW[5:0] included in the output data ODATA of the timing controller 200. The pulse width of the first coupling pulse signal SLEW_LVi may be determined or adjusted by the control code CSPW[5:0].

Figure 5:
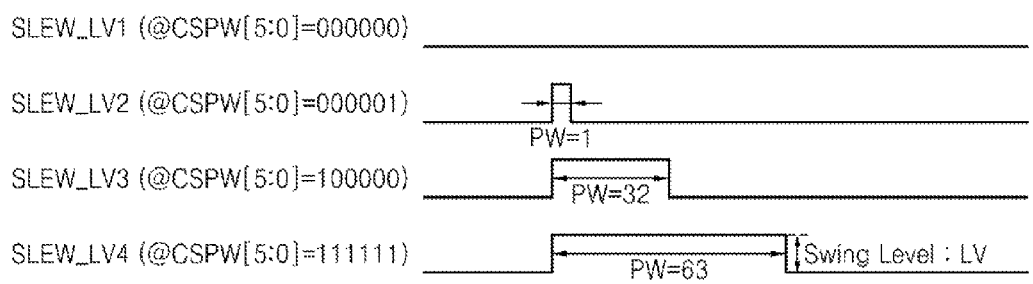
FIG. 5 is a waveform diagram of the output signals of a coupling pulse signal generator illustrated in FIG. 2.

Although the control code CSPW[5:0] having 6 bits is illustrated in FIGS. 2 and 5 for clarity of the description, the number of bits included in the control code CSPW may vary in accordance with an exemplary embodiment.

The pulse level shifter 113 may function as a level shifter. The pulse level shifter 113 may shift the level of the first coupling pulse signal SLEW_LVi to a predetermined level to generate a level-shifted coupling pulse signal (hereinafter, referred to as a second coupling pulse signal) SLEW. The second coupling pulse signal SLEW may function as a control voltage for controlling the slew rate of an output voltage.

The first inverter IV1 may invert the second coupling pulse signal SLEW and the second inverter IV2 may invert the output signal of the first inverter IV1. When the delay of the inverters IV1, IV2 is ignored, the phase of the output signal of the first inverter IV1 is opposite to that of the second coupling pulse signal SLEW and the phase of the output signal of the second inverter IV2 is the same as that of the second coupling pulse signal SLEW.

Referring to FIG. 5, when the control code CSPW[5:0] is "000000", a pulse width PW of the first coupling pulse signal SLEW_LV1 is "0". When the control code CSPW[5:0] is "000001", the pulse width PW of the first coupling pulse signal SLEW_LV2 is "1". When the control code CSPW[5:0] is "100000", the pulse width PW of the first coupling pulse signal SLEW_LV3 is "32". When the control code CSPW[5:0] is "111111", the pulse width PW of the first coupling pulse signal SLEW_LV4 is "63". Here, numbers "1", "32", and "63" indicate a relative pulse width. For instance, "1" may indicate 1/63; "32" may indicate 32/63, and "63" may indicate 63/63. The slewing interval may be defined differently depending on the pulse width PW.

Referring back to FIG. 2, the first channel buffer block 130-1 may include a first input stage IS1, a first load stage LS1, and a first output stage OS1. The first input stage IS1 may include a first current generation circuit 131-1, a first amplification circuit 133-1, a first coupling capacitor C1H, and a second coupling capacitor C2H. The first current generation circuit 131-1 may include a first transistor MP1H connected between a first line for supplying a first voltage and a first node N3H and a second transistor MN1H connected between a second node N4H and a second line for supplying a second voltage.

The first voltage may be AVDD and the second voltage may be HAVDD. In other exemplary embodiments, the first voltage may be +HAVDD and the second voltage may be a ground voltage (GND). When the first voltage is AVDD and the second voltage is HAVDD, the second voltage may be half the first voltage.

The first transistor MP1H may function as a first bias circuit and the second transistor MN1H may function as a second bias circuit.

A first bias voltage VB1H is applied to a gate of the first transistor MP1H via a first bias line N1H and a signal (i.e., the output signal of the first inverter IV1) having a phase opposite to that of the second coupling pulse signal SLEW is applied to the first bias line N1H via the first coupling capacitor C1H during a slewing interval.

In more detail, the output signal of the first inverter IV1, which has a constant pulse width, is applied to the first bias line N1H through the first coupling capacitor C1H during the slewing interval, and the output signal of the first inverter IV1 may change the voltage of the gate of the first transistor MP1H due to a coupling effect.

For example, when the pulse width of the second coupling pulse signal SLEW increases, the change in the first bias voltage VB1H and the voltage of the gate of the first transistor MP1H also increases. Further, when the first coupling capacitor C1H exists, the output signal of the first inverter IV1 may be applied to the first bias line N1H and a first bias current I1 may increase as the first bias voltage VB1H decreases.

A second bias voltage VB2H is applied to a gate of the second transistor MN1H via a second bias line N2H and a signal (i.e., the output signal of the second inverter IV2) having a phase the same as that of the second coupling pulse signal SLEW is applied to the second bias line N2H via the second coupling capacitor C2H during a slewing interval.

In more detail, the output signal of the second inverter IV2, which has a constant pulse width, is applied to the second bias line N2H through the second coupling capacitor C2H during the slewing interval, and the output signal of the second inverter IV2 may change the voltage of the gate of the second transistor MN1H due to a coupling effect.

For example, when the pulse width of the second coupling pulse signal SLEW increases, the change in the second bias voltage VB2H and the voltage of the gate of the second transistor MN1H also increases. Further, when the second coupling capacitor C2H exists, the output signal of the second inverter IV2 may be applied to the second bias line N2H and a second bias current I2 may increase as the second bias voltage VB2H increases.

The first amplification circuit 133-1 may include a first transistor pair that amplifies a difference between input voltages VIH, VOH using the first bias current I1 flowing in the first transistor MP1H and a second transistor pair that amplifies a difference between the input voltages VIH, VOH using the second bias current I2 flowing in the second transistor MN1H.

The first transistor MP1H may generate the first bias current I1 inversely proportional to the first bias voltage VB and the second transistor MN1H may generate the second bias current I2 proportional to the second bias voltage VB2H. When the bias voltages VB1H, VB2H are constant, the transistors MP1H, MN1H may function as a constant current source.

When the first transistor MP1H is implemented as a P-channel metal-oxide semiconductor (PMOS) transistor, the first transistor pair consists of PMOS transistors and a first differential amplifier includes PMOS transistors. When the second transistor MN1H is implemented as an N-channel metal-oxide semiconductor (NMOS) transistor, the second transistor pair consists of NMOS transistors and a second differential amplifier includes NMOS transistors. Signals amplified by the first transistor pair and signals amplified by the second transistor pair are applied to the first load stage LS1.

The first output stage OS1 outputs the first output voltage VOH in response to signals output from the first load stage LS1. During a stewing interval, a signal (i.e., the output signal of each of the inverters IV1, IV2) related with the second coupling pulse signal SLEW having a constant pulse width is applied to the bias line N1H or the bias line N2H through the coupling capacitor C1H or coupling capacitor C2H. Accordingly, when the pulse width of the second coupling pulse signal SLEW increases, the change in the voltage of the gate of the transistors MP1H, MN1H also increases due to a coupling effect.

When the input voltage VIH increases, the voltage of the second node N4H increases and the second bias voltage VB2H increases due to the coupling effect. Accordingly, the second bias current I2 flowing in the second transistor MN1H also increases. When the second bias current I2 flowing in the second transistor MN1H increases, the slew rate of the first output voltage VOH increases.

When the input voltage VIH decreases, the voltage of the first node N3H decreases and the first bias voltage VB1H decreases due to the coupling effect. Accordingly, the first bias current I1 flowing in the first transistor MP1H increases. When the first bias current I1 flowing in the first transistor MP1H increases, the slew rate of the first output voltage VOH increases.

The second channel buffer block 130-2 may include a second input stage IS2, a second load stage LS2, and a second output stage OS2. The second input stage IS2 may include a second current generation circuit 131-2, a second amplification circuit 133-2, a third coupling capacitor C1L, and a fourth coupling capacitor C2L.

The second current generation circuit 131-2 may include a third transistor MP1L connected between the second line for supplying the second voltage and a third node N3L and a fourth transistor MN1L connected between a fourth node N4L and a third line for supplying a third voltage.

The third voltage may be GND or −HAVDD. The first and second voltages may be set to AVDD and HAVDD, respectively, as described above, and the third voltage may be set to GND. In other exemplary embodiments, the first through third voltages may be set to +HAVDD, GND, and −HAVDD, respectively. It is apparent that the first and third voltages are set to complementary voltages, respectively, on the basis of GND.

A third bias voltage VB1L is applied to a gate of the third transistor MP1L via a third bias line N1L and a signal (i.e., the output signal of the first inverter IV1) having a phase opposite to that of the second coupling pulse signal SLEW is applied to the third bias line N1L via the third coupling capacitor C1L during a slewing interval.

In more detail, the output signal of the first inverter IV1, which has a constant pulse width, is applied to the third bias line N1L through the third coupling capacitor C1L during the slewing interval, and the output signal of the first inverter IV1 may change the voltage of the gate of the third transistor MP1L due to a coupling effect.

For example, when the third coupling capacitor C1L exists, the output signal of the first inverter IV1 may be applied to the third bias line N1L and a third bias current I3 may increase as the third bias voltage VB1L decreases.

A fourth bias voltage VB2L is applied to a gate of the fourth transistor MN via a fourth bias line N2L and a signal (i.e., the output signal of the second inverter IV2) having a phase the same as that of the second coupling pulse signal SLEW is applied to the fourth bias line N2L via the fourth coupling capacitor C2L during a slewing interval.

In more detail, the output signal of the second inverter IV2, which has a constant pulse width, is applied to the fourth bias line N2L through the fourth coupling capacitor C2L during the slewing interval, and the output signal of the second inverter IV2 may change the voltage of the gate of the fourth transistor MN1L due to a coupling effect.

For example, when the fourth coupling capacitor C2L exists, the output signal of the second inverter IV2 may be applied to the fourth bias line N2L and a fourth bias current I4 may increase as the fourth bias voltage VB2L increases.

The second amplification circuit 133-2 includes a third transistor pair that amplifies a difference between input voltages VIL, VOL using the third bias current I3 flowing in the third transistor MP1L and a fourth transistor pair that amplifies a difference between the input voltages VIL, VOL using the fourth bias current I4 flowing in the fourth transistor MN1L. Here, the input voltages VIL, VOL may be defined as signals related with pixel data included in a data packet.

When the third transistor MP1L is implemented as a PMOS transistor, the third transistor pair consists of PMOS transistors and a third differential amplifier includes PMOS transistors. When the fourth transistor MN1L is implemented as an NMOS transistor, the fourth transistor pair consists of NMOS transistors and a fourth differential amplifier includes NMOS transistors. Signals amplified by the third transistor pair and signals amplified by the fourth transistor pair are applied to the second load stage LS2.

The second output stage OS2 outputs the second output voltage VOL in response to signals output from the second load stage LS2. During a slewing interval, a signal (i.e., the output signal of each of the inverters IV1, IV2) related with the second coupling pulse signal SLEW having a constant pulse width is applied to the bias line N1L or the bias line N2L through the coupling capacitor C1L or the coupling capacitor C2L. Accordingly, when the pulse width of the second coupling pulse signal SLEW increases, the change in the voltage of the gate of the transistors MP1L, MN1L also increases due to a coupling effect.

At this time, when the input voltage VIL increases, the voltage of the fourth node N4L increases and the fourth bias voltage VB2L increases due to the coupling effect. Accordingly, the fourth bias current I4 flowing in the fourth transistor MN1L also increases. When the fourth bias current I4 flowing in the fourth transistor MN1L increases, the slew rate of the second output voltage VOL increases.

When the input voltage VIL decreases, the voltage of the third node N3L decreases and the third bias voltage VB1L decreases due to the coupling effect. Accordingly, the third bias current I3 flowing in the third transistor MP1L increases. When the third bias current I3 flowing in the third transistor MP1L increases, the slew rate of the second output voltage VOL increases.

Consequently, the first channel buffer block 130-1 and the second channel buffer block 130-2 increase the bias currents I1, I2, I3, I4 using the coupling effect and they output the output voltages VOH, VOL, respectively, having a high slew rate without increasing a standby current. The structure and the operations of the first channel buffer block 130-1 are substantially the same as those of the second channel buffer block 130-2.

Figure 3:
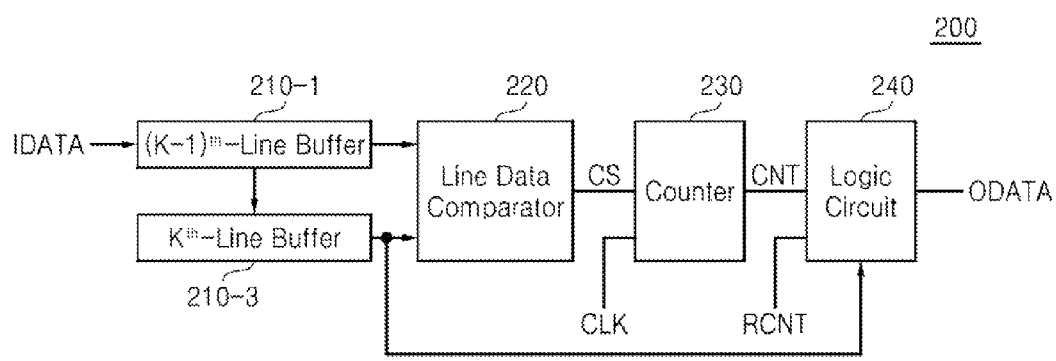
FIG. 3 is a block diagram of the timing controller illustrated in FIG. 1 according to an exemplary embodiment of the inventive concepts.

FIG. 3 is a block diagram of the timing controller 200 illustrated in FIG. 1 according to an exemplary embodiment of the inventive concepts. Referring to FIGS. 1 and 3, the timing controller 200 includes a first line buffer 210-1, a second line buffer 210-3, a line data comparator 220, a counter 230, and the logic circuit 240.

The first line buffer 210-1 may store $(K-1)^{th}$ line data (i.e., previous line data) of the display data IDATA, where K is a natural number of at least 2. The second line buffer 210-3 may store $K^{th}$ line data (i.e., current line data) of the display data IDATA. The positions of the first line buffers 210-1, 210-3 may be changed in other exemplary embodiments. As shown in FIG. 3, the $K^{th}$ line data may be transmitted to the second line buffer 210-3 via the first line buffer 210-1.

The line data comparator 220 may compare the previous line data output from the first line buffer 210-1 with the current line data output from the second line buffer 210-3 in units of pixel data and may output a comparison signal CS corresponding to the comparison result to the counter 230. For example, pixel data may be m-bit data, where "m" is a natural number.

For example, the line data comparator 220 may compare a most significant bit (MSB) in an $i^{th}$ pixel data set (where "i" is a natural number and 1≤i≤X) among X pixel data sets (where X is a natural number) included in the previous line data with an MSB in the $i^{th}$ pixel data set among X pixel data sets included in the current line data and may output the comparison signal CS for each pixel data set to the counter 230 according to the comparison result.

For example, when two corresponding MSBs have the same value, the line data comparator 220 may output the comparison signal CS at a first level (e.g., one of a low level and a high level). When two corresponding MSBs have different values, the line data comparator 220 may output the comparison signal CS at a second level (e.g., the other of the low level and the high level).

The counter 230 may count the number of comparison signals CS at the second level in response to a clock signal CLK and may output a count value CNT to the logic circuit 240. The logic circuit 240 may compare the count value CNT with a reference value RCNT and may generate the output voltage ODATA having a format illustrated in FIG. 4. For example, when the count value CNT is greater than the reference value RCNT, the logic circuit 240 may generate and output the output voltage ODATA including the control code CSPW[5:0]. The reference value RCNT may be set to X/2, but it may vary with embodiments.

The control code CSPW[5:0] may be determined by the count value CNT. For example, when the count value CNT is equal to or less than X/2, the control code CSPW[5:0] may be set to "000000". When the count value CNT is X, the control code CSPW[5:0] may be set to "111111". In other words, when the count value CNT is greater than X/2 and less than X, the control code CSPW[5:0] may be set to one of from "000001" to "111110".

Figure 4:
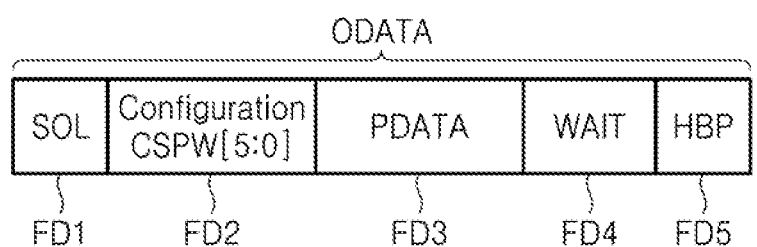
FIG. 4 is a diagram of a data packet generated in the timing controller illustrated in FIG. 1.

FIG. 4 is a diagram of a data packet generated in the timing controller 200 illustrated in FIG. 1. The output voltage ODATA, i.e., the data packet may be generated by the logic circuit 240. The data packet ODATA may include first through fifth fields FD1 through FD5.

The first field FD1 is a start of line (SOL) field and may include a notification pattern of a data transmission start. The second field FD2 is a configuration field and may include the control code CSPW[5:0].

The third field FD3 is a display data field and may include pixel data PDATA. For example, the display data IDATA may be the same as the pixel data PDATA. The fourth field FD4 is a wait field and may include receiver latency. The fifth field FD5 is a blank time field, e.g., a horizontal blank period (HBP) field and indicates an end of line.

FIG. 5 is a waveform diagram of the output signals of the coupling pulse signal generator 111 illustrated in FIG. 2. It is assumed that the first coupling pulse signals SLEW_LVi (where i=1, 2, 3, and 4) have the same swing level LV.

FIGS. 6A and 6B are waveform diagrams of the output signals of the pulse width control circuit 110 and the first channel buffer block 130-1 illustrated in FIG. 2. In FIGS. 6A and 6B, the dotted lines show the waveforms of an output voltage VOH' when the coupling capacitors C1H, C2H do not exist and the solid lines show the waveforms of the output voltage VOH when the coupling capacitors C1H, C2H exist. As shown in FIGS. 6A and 6B, the output signals VOH', VOH may change from AVDD to HAVDD or from HAVDD to AVDD. Although not shown in FIGS. 6A and 6B, an input signal may have a square wave.

FIG. 6A shows the waveforms of the first bias voltage VB1H, the second bias voltage VB2H, and the first output voltage VOH which change according to the output signal of the pulse level shifter 113, i.e., the second coupling pulse signal SLEW corresponding to the first coupling pulse signal SLEW_LV4 when the control code CSPW[5:0] is "111111". A swing level HV of the second coupling pulse signal SLEW is greater than the swing level LV of the first coupling pulse signal SLEW_LV4. The swing level HV of the second coupling pulse signal SLEW may be determined by the pulse level shifter 113.

During a slewing interval, signals (e.g., the output signals of the inverters IV1 and IV2) related with the second coupling pulse signal SLEW are applied to the bias lines N1H, N2H through the coupling capacitors C1H, C2H, respectively, and therefore, the bias voltages VB1H, VB2H change due to the coupling effect. In other words, the greater the pulse width of the second coupling pulse signal SLEW, the bias voltages VB1H, VB2H change more due to the coupling effect. For example, the first bias voltage VB1H decreases and the second bias voltage VB2H increases. When the first bias voltage VB1H decreases, the first bias current I1 increases. When the second bias voltage VB2H increases, the second bias current I2 increases.

Since the voltage of the first node N3H and the first bias voltage VB1H decrease when the input voltage VIH decreases, the first bias current I1 increases. As a result, the slew rate of the first output voltage VOH increases.

FIG. 6B shows the waveforms of the first bias voltage VB1H, the second bias voltage VB2H, and the first output voltage VOH which change according to the output signal of the pulse level shifter 113, i.e., the second coupling pulse signal SLEW corresponding to the first coupling pulse signal SLEW_LV4 when the control code CSPW[5:0] is "1000000". The swing level HV of the second coupling pulse signal SLEW is greater than the swing level LV of the first coupling pulse signal SLEW_LV3. The swing level HV of the second coupling pulse signal SLEW may be determined by the pulse level shifter 113.

During a slewing interval, signals (e.g., the output signals of the inverters IV1 and IV2) related with the second coupling pulse signal SLEW are applied to the bias lines N1H, N2H through the coupling capacitors C1H, C2H, respectively, and therefore, the bias voltages VB1H, VB2H change due to the coupling effect. For example, the first bias voltage VB1H decreases and the second bias voltage VB2H increases. When the first bias voltage VB1H decreases, the first bias current I1 increases. When the second bias voltage VB2H increases, the second bias current I2 increases.

Since the voltage of the first node N3H and the first bias voltage VB1H decrease when the input voltage VIH decreases, the first bias current I1 increases. As a result, the slew rate of the first output voltage VOH increases.

For example, when the pulse width PW of the second coupling pulse signal SLEW illustrated in FIG. 6A is 63 and the pulse width PW of the second coupling pulse signal SLEW illustrated in FIG. 6B is 32, the output voltage VOH illustrated in FIG. 6A may swing between the first voltage and the second voltage and the output voltage VOH illustrated in FIG. 6B may swing between about HAVDD+HAVDD/2 and HAVDD. Referring to FIGS. 6A and 6B, when the pulse width PW of the second coupling pulse signal SLEW increases, the swing width of the output voltage VOH also increases.

Figures 7A, 7B:
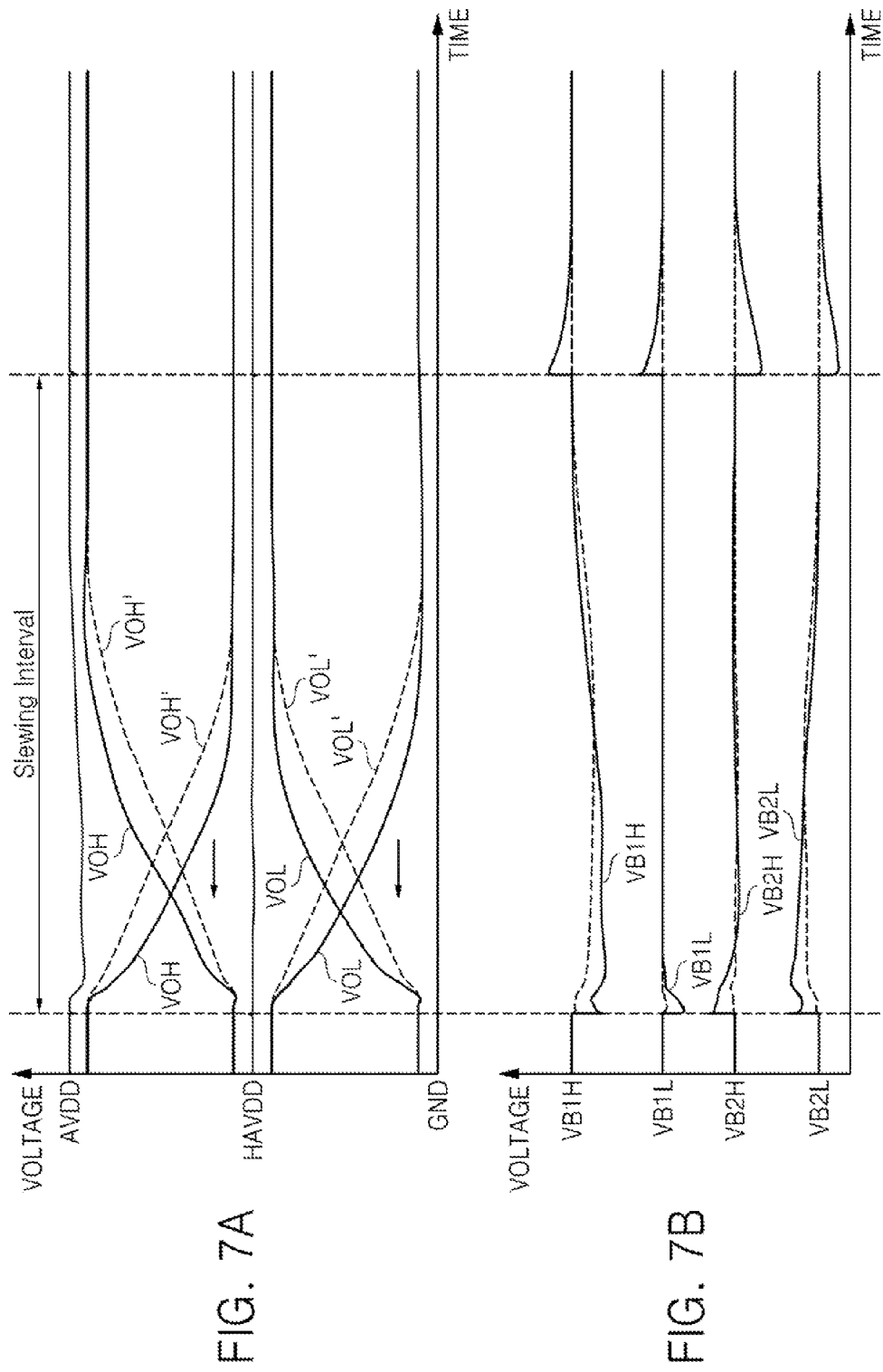
FIGS. 7A and 7B are waveform diagrams of the output signals of the channel buffer block illustrated in FIG. 2.

FIGS. 7A and 7B are waveform diagrams of the output signals of the channel buffer blocks 130-1 and 130-2 illustrated in FIG. 2.

Referring to FIG. 7A, the dotted lines show the waveforms of output voltages VOH', VOL' when the coupling capacitors C1H, C2H, C1L, C2L do not exist and the solid lines show the waveforms of the output voltages VOH, VOL when the coupling capacitors C1H, C2H, C1L, C2L exist.

As shown in FIG. 7A, the output signals VOH', VOH, VOL', VOL may change from AVDD (or HAVDD) to HAVDD (or GND) or may change from HAVDD (or GND) to AVDD (or HAVDD). Although not shown in FIG. 7A, an input signal may have a square waveform. When the coupling capacitors C1H, C2H, C1L, C2L exist, the slew rate of the output voltages VOH, VOL increases.

Referring to FIG. 7B, the dotted lines show the waveforms of the bias voltages VB1H, VB1L, VB2H, VB2L when the coupling capacitors C1H, C2H, C1L, C2L do not exist and the solid lines show the waveforms of the bias voltages VB1H, VB1L, VB2H, VB2L when the coupling capacitors C1H, C2H, C1L, C2L exist. The change occurring in the bias voltages VB1H, VB1L, VB2H, VB2L when the coupling capacitors C1H, C2H, C1L, C2L exist is greater than the change occurring when the coupling capacitors C1H, C2H, C1L, C2L do not exist.

Figure 8:
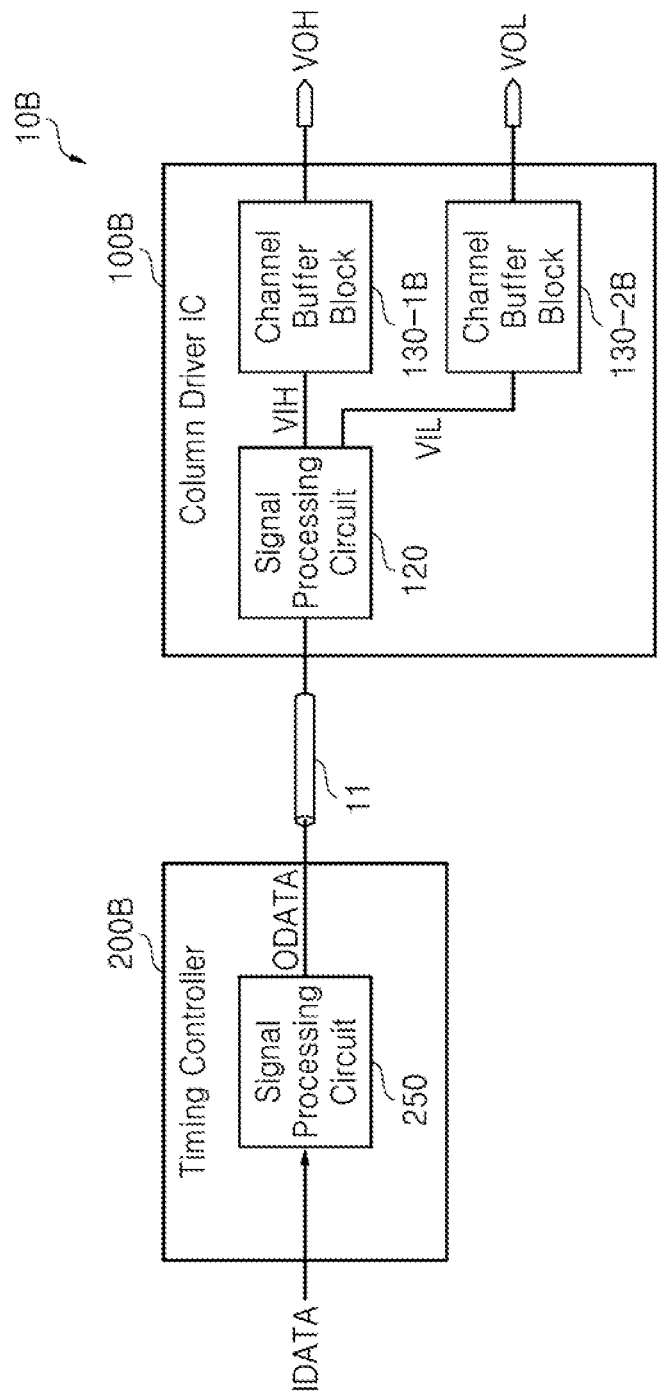
FIG. 8 is a block diagram of a display system including a timing controller and a column driver IC according to an exemplary embodiment of the inventive concepts.

FIG. 8 is a block diagram of a display system 10B including a timing controller 200B and a column driver IC 100B according to an exemplary embodiment of the inventive concepts. Referring to FIG. 8, the display system 10B may include a timing controller 200B, a serial interface 11, and a column driver IC 100B.

A signal processing circuit 250 included in the timing controller 200B receives and processes the display data IDATA and outputs the output data ODATA corresponding to the process result to the column driver IC 100B via the serial interface 11. The output data ODATA may be transmitted to the serial interface 11 in a form of a data packet. The column driver IC 100E may include a signal processing circuit 120, a first channel buffer block 130-1B, and a second channel buffer block 130-2B.

The signal processing circuit 120 may generate the input signals VIH, VIL related with pixel data included in the data packet.

The structure and the functions of the first channel buffer block 130-1B are substantially the same as those of the second channel buffer block 130-2B. Therefore, the structure and the functions of the second channel buffer block 130-2B will be understood from the description of the structure and the functions of the first channel buffer block 130-1B.

Figure 9:
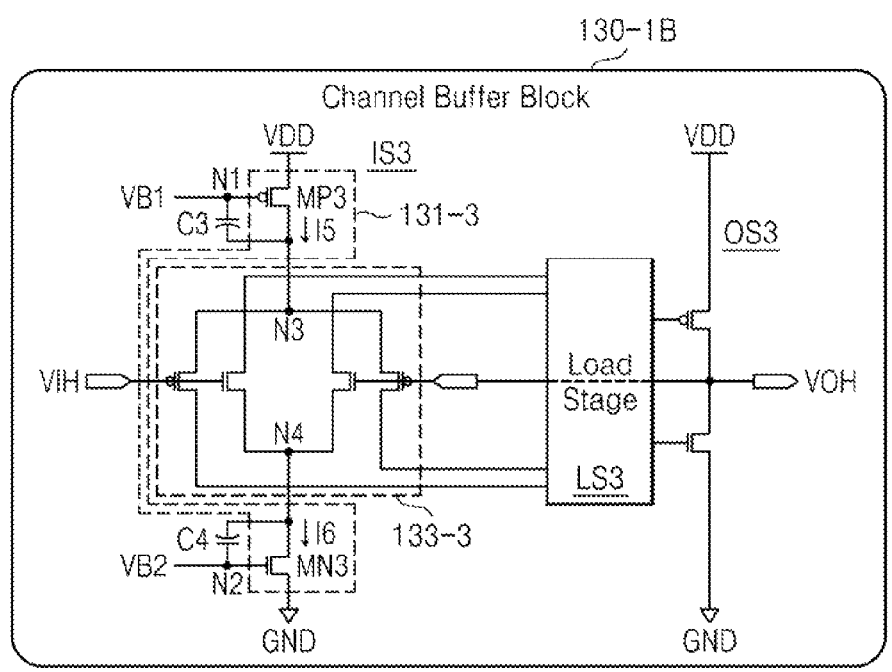
FIG. 9 is a block diagram of a channel buffer block illustrated in FIG. 8, which includes self-boosting capacitors.

FIG. 9 is a block diagram of the first channel buffer block 130-1B illustrated in FIG. 8, which includes self-boosting capacitors C3 and C4. Referring to FIGS. 8 and 9, the first channel buffer block 130-1B may induce a coupling effect using the voltage change in internal nodes N3 and N4 without receiving a data packet including a special control code. In more detail, the channel buffer block 130-1B may generate the output signal VOH using the input signal VIH related with pixel data included in a data packet output from the timing controller 200B.

Referring to FIG. 9, the channel buffer block 130-1B includes an input stage IS3, a load stage LS3, and an output stage OS3.

The input stage IS3 includes a current generation circuit 131-3, an amplification circuit 133-3, a first self-boosting coupling capacitor C3, and a second self-boosting coupling capacitor C4. The self-boosting coupling capacitors C3, C4 may be simply called coupling capacitors C3, C4. Unlike the first through fourth coupling capacitors C1H, C2H, C1L, C2L that induce the coupling effect according to a signal related with the second coupling pulse signal SLEW generated by the pulse width control circuit 110 illustrated in FIG. 2, the self-boosting coupling capacitors C3, C4 may induce the coupling effect according to the voltage change in the internal nodes N3, N4 without using any external input.

The current generation circuit 131-3 may include a first transistor MP3 connected between a fourth line for supplying a fourth voltage VDD and the first internal node N3 and a second transistor MN3 connected between the second internal node N4 and a third line for supplying GND. The transistors MP3, MN3 may function as a bias circuit.

A first bias voltage VB1 is applied to a gate of the first transistor MP3 through a first bias line N1 and the first self-boosting coupling capacitor C3 is connected between the first bias line N1 and the first internal node N3. A second bias voltage VB2 is applied to a gate of the second transistor MN3 through a second bias line N2 and the second self-boosting coupling capacitor C4 is connected between the second bias line N2 and the second internal node N2.

The amplification circuit 133-3 includes a first transistor pair that amplifies a difference between the input voltages VIH, VOH using a fifth bias current I5 flowing in the first transistor MP3 and a second transistor pair that amplifies a difference between the input voltages VIH, VOH using a sixth bias current I6 flowing in the second transistor MN3.

When the first transistor MP3 is a PMOS transistor, the first transistor pair consists of PMOS transistors, and a first differential amplifier includes PMOS transistors. The first internal node N3 is a common node of the PMOS transistors. When the second transistor MN3 is an NMOS transistor, the second transistor pair consists of NMOS transistors, and a second differential amplifier includes NMOS transistors. The second internal node N4 is a common node of the NMOS transistors. Signals amplified by the first transistor pair and signals amplified by the second transistor pair are applied to the load stage LS3.

The output stage OS3 outputs the output voltage VOH in response to signals output from the load stage LS3.

During a slewing interval, the voltage change in each of the internal nodes N3, N4 is reflected on the bias line N1 or the bias line N2 through the self-boosting coupling capacitor C3 or the coupling capacitor C4. In other words, the voltage of the gate of each of the transistors MP3, MN3 is changed due to a coupling effect. For example, the voltage change may range from 200 to 300 mV, but it is just an example.

When the input voltage VIH increases during the slewing interval, the voltage of the second internal node N4 increases and the second bias voltage VB2 effectively increases due to the coupling effect. As a result, the sixth bias current I6 flowing in the second transistor MN3 also increases. When the sixth bias current I6 flowing in the second transistor MN3 increases, the slew rate of the output voltage VOH increases. When the input voltage VIH decreases during the slewing interval, the voltage of the first internal node N3 decreases and the first bias voltage VB1 effectively decreases due to the coupling effect. As a result, the fifth bias current I5 flowing in the first transistor MP3 increases. When the fifth bias current I5 flowing in the first transistor MP3 increases, the slew rate of the output voltage VOH increases.

Figure 10:
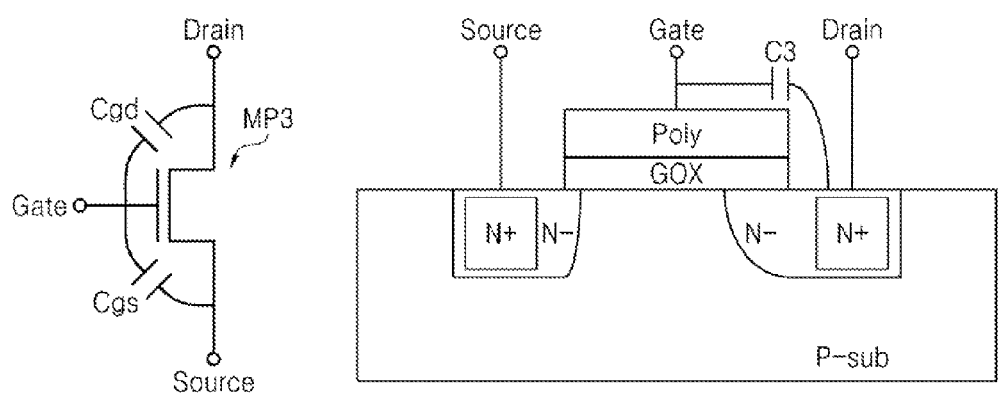
FIG. 10 is a diagram of a modeling circuit of a transistor including a self-boosting capacitor illustrated in FIG. 9 and the cross-section of the transistor.

FIG. 10 is a diagram of a modeling circuit of a transistor including the self-boosting capacitor C3 illustrated in FIG. 9 and the cross-section of the transistor. Referring to FIGS. 9 and 10, a reference character Cgd denotes a parasitic capacitor between the gate and the drain of the first transistor MP3 and a reference character Cgs denotes a parasitic capacitor between the gate and the source of the first transistor MP3. The first self-boosting coupling capacitor C3 may be formed between the gate and the drain of the first transistor MP3.

In other words, unlike the first through fourth coupling capacitors C1H, C2H, C1L, C2L that receive a signal related with the second coupling pulse signal SLEW generated by the pulse width control circuit 110 illustrated in FIG. 2 and induce the coupling effect, the first coupling capacitor C3 may induce the coupling effect by itself according to the voltage change in the internal node N3.

Figure 11:
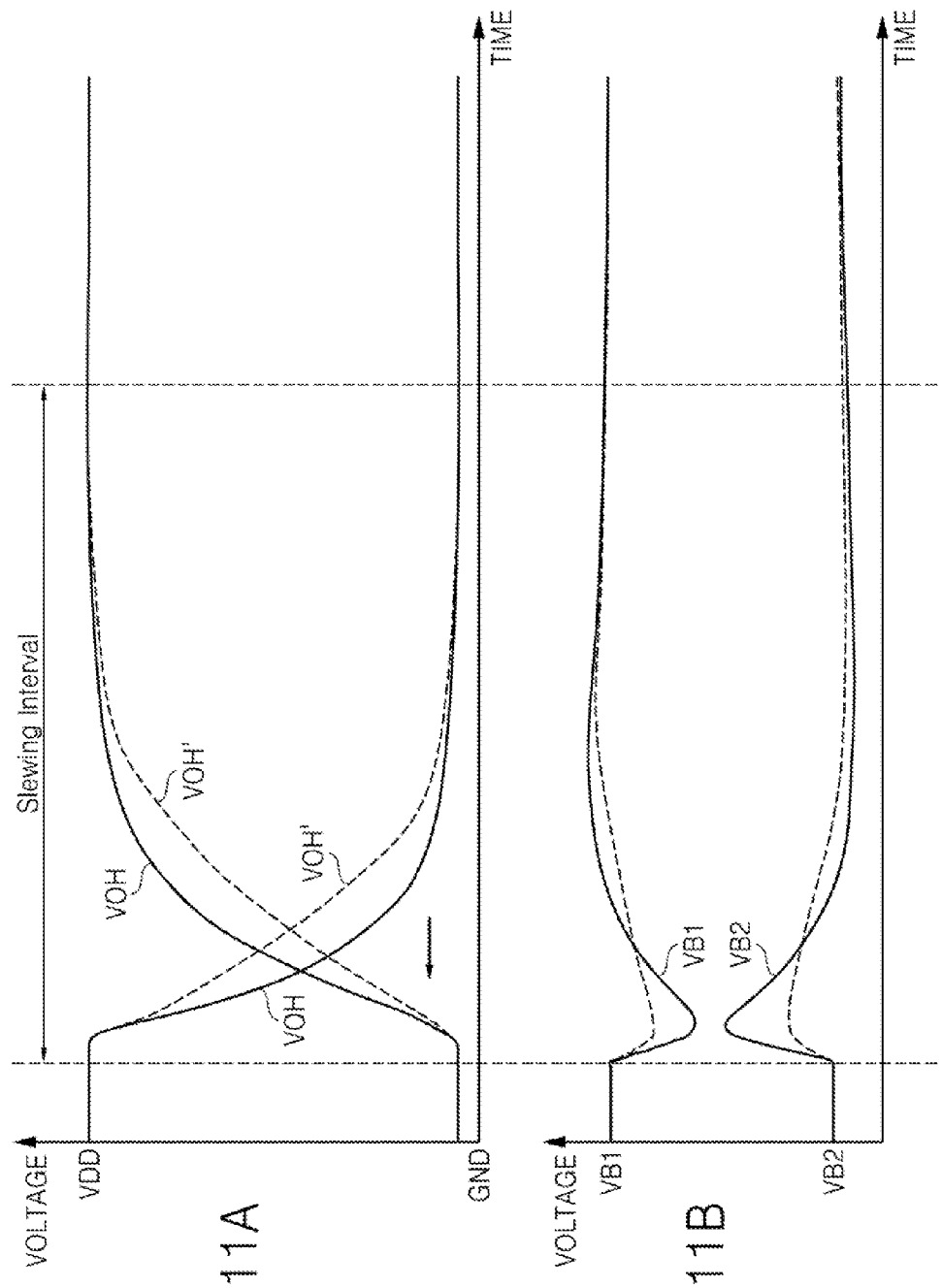
FIGS. 11A and 11B are waveform diagrams of the output signals of the channel buffer block illustrated in FIG. 9.

FIGS. 11A and 11B are waveform diagrams of the output signals of the channel buffer block 130-1B illustrated in FIG. 9. Referring to FIG. 11A, the dotted lines show the waveforms of the output voltage VOH' when the self-boosting coupling capacitors C3, C4 do not exist and the solid lines show the waveforms of the output voltage VOH when the self-boosting coupling capacitors C3, C4 exist. As shown in FIG. 11A, the output signals VOH' and VOH may change from VDD to GND or may change from GND to VDD. Although not shown in FIG. 11A, an input signal may have a square waveform. When the self-boosting coupling capacitors C3, C4 exist, the slew rate of the output voltage VOH increases.

Referring to FIG. 11B, the dotted lines show the waveforms of the bias voltages VB1, VB2 when the self-boosting coupling capacitors C3, C4 do not exist and the solid lines show the waveforms of the bias voltages VB1, VB2 when the self-boosting coupling capacitors C3, C4 exist. The change occurring in the bias voltages VB1, VB2 when the self-boosting coupling capacitors C3, C4 exist is greater than the change occurring when the self-boosting coupling capacitors C3, C4 do not exist.

Figure 12:
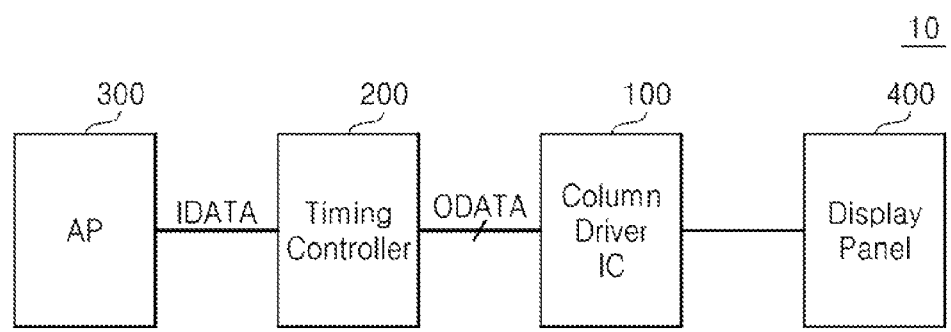
FIG. 12 is a block diagram of a system including the display system illustrated in FIG. 1 or 8.

FIG. 12 is a block diagram of an image processing system 10 including a display system having the structure illustrated in FIG. 1 or 8. The image processing system 10 includes an application processor (AP) 300, a timing controller 200, a column driver IC 100, and a display panel 400. The timing controller 200 is the timing controller 200 illustrated in FIG. 1 or the timing controller 200B illustrated in FIG. 8 and the column driver IC 100 is the column driver IC 100 illustrated in FIG. 1 or the column driver IC 100B illustrated in FIG. 8.

The image processing system 10 may be implemented as a PC or a portable electronic device. The portable electronic device may be a smart phone, a tablet PC, a MID, a digital camera, a camcorder, a personal digital assistant (PDA), a navigation device, or a wearable computer.

The AP 300 may control the timing controller 200 and transmit the display data IDATA to the timing controller 200. The AP 300 may function as a host and may be implemented in an IC or a system on chip (SoC). Although the timing controller 200 is separated from the AP 300 in the exemplary embodiment illustrated in FIG. 12, the AP 300 may include the timing controller 200 in other exemplary embodiments.

The timing controller 200 may receive the display data IDATA, compare two adjacent line data included in the display data IDATA in units of pixel data, generate the output data ODATA including the control code CSPW[5:0] according to the comparison result, and transmit the output data ODATA to the column driver IC 100 through the serial interface 11. The timing controller 200B may receive and process the display data IDATA and transmit the output data ODATA to the column driver IC 100B through the serial interface 11. The display panel 400 may display data received from the column driver IC 100.

Figure 13:
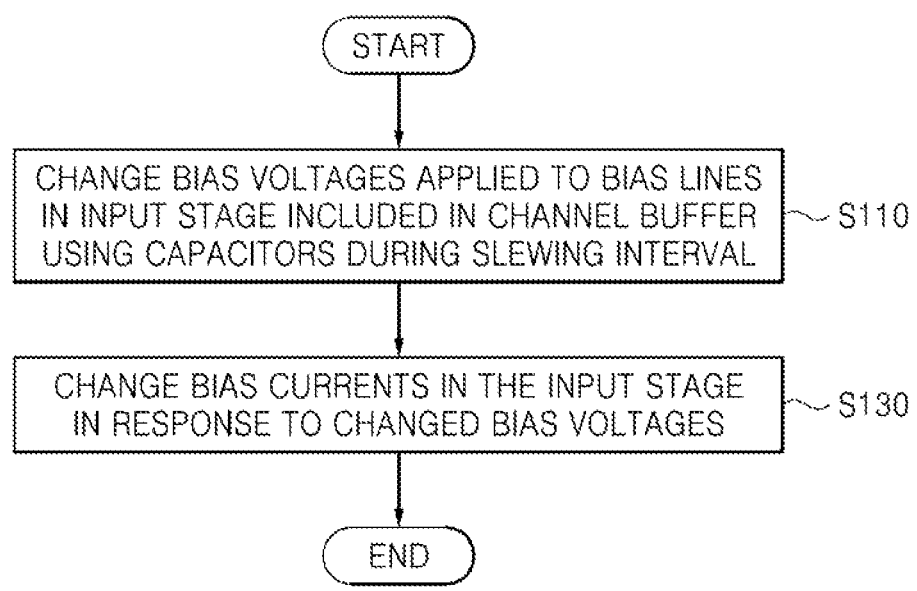
FIG. 13 is a flowchart of a method of operating a channel buffer block according to an exemplary embodiment of the inventive concepts.

FIG. 13 is a flowchart of a method of operating a channel buffer block according to exemplary embodiments of the inventive concepts. Referring to FIGS. 1 through 13, the channel buffer blocks 130-1, 13-2 included in the column driver IC 100 or the channel buffer blocks 130-1B, 130-2B included in the column driver IC 100E change bias voltages applied to bias lines in an input stage included therein using coupling capacitors during a slewing interval in operation S110.

When the bias voltages change, bias currents in the input stage increase due to a coupling effect. When the bias currents increase, the slew rate of an output voltage increases in operation S130.

As described above, according to exemplary embodiments of the inventive concepts, a device outputs a voltage having a high slew rate without increasing a standby current, thereby reducing power consumption of a low-power, high-resolution display.

While the inventive concepts have been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. A column driver integrated circuit (IC) having a channel buffer block, wherein the channel buffer block comprises:
    a first differential amplifier having a first bias circuit configured to generate a first bias current inversely proportional to a first bias voltage and a first transistor pair configured to amplify a difference between input voltages using the first bias current;
    a second differential amplifier having a second bias circuit configured to generate a second bias current proportional to a second bias voltage and a second transistor pair configured to amplify the difference between the input voltages using the second bias current;

a first coupling capacitor configured to decrease the first bias voltage using a first control voltage during a slewing interval; and a second coupling capacitor configured to increase the second bias voltage using a second control voltage during the slewing interval.

2. The column driver IC of claim 1, wherein the first control voltage and the second control voltage are received from outside of the channel buffer block and a phase of the first control voltage is opposite to a phase of the second control voltage during the slewing interval.

3. The column driver IC of claim 2, further comprising a pulse width control circuit configured to control a pulse width of the first control voltage using a control code output from a timing controller.

4. The column driver IC of claim 1, wherein the first control voltage is a voltage of a first common node of the first bias circuit and the first transistor pair and the second control voltage is a voltage of a second common node of the second bias circuit and the second transistor pair.

5. The column driver IC of claim 4, wherein the voltage of the first common node decreases when one of the input voltages decreases and the voltage of the second common node increases when the one of the input voltages increases.

6. A display system comprising:
the column driver integrated circuit (IC) of claim 1; and
a timing controller configured to control operation of the column driver IC.

7. The display system of claim 6, wherein the first control voltage and the second control voltage are received from outside of the channel buffer block and a phase of the first control voltage is opposite to a phase of the second control voltage during the slewing interval.

8. The display system of claim 7, wherein the column driver IC further comprises a pulse width control circuit configured to control a pulse width of the first control voltage using a control code output from a timing controller.

9. The display system of claim 8, wherein the timing controller is configured to compare previous line data in display data with current line data in the display data and to generate the control code according to a comparison result.

10. The display system of claim 8, further comprising a serial interface connected between the column driver IC and the timing controller,
wherein the timing controller is configured to generate a data packet having the display data and the control code and to transmit the generated data packet to the column driver IC through the serial interface.

11. The display system of claim 6, wherein the first control voltage is a voltage of a first common node of the first bias circuit and the first transistor pair and the second control voltage is a voltage of a second common node of the second bias circuit and the second transistor pair.

12. An image processing system comprising:
a column driver integrated circuit (IC) having a channel buffer block;
a timing controller configured to control operation of the column driver IC; and
a processor configured to control operation of the timing controller,
wherein the channel buffer block comprises:
a first differential amplifier having a first bias circuit configured to generate a first bias current inversely proportional to a first bias voltage and a first transistor pair configured to amplify a difference between input voltages using the first bias current;
a second differential amplifier having a second bias circuit configured to generate a second bias current proportional to a second bias voltage and a second transistor pair configured to amplify the difference between the input voltages using the second bias current;
a first coupling capacitor configured to decrease the first bias voltage using a first control voltage during a slewing interval; and
a second coupling capacitor configured to increase the second bias voltage using a second control voltage during the slewing interval.

13. The image processing system of claim 12, wherein the first control voltage and the second control voltage are received from outside of the channel buffer block and a phase of the first control voltage is opposite to a phase of the second control voltage during the slewing interval.

14. The image processing system of claim 13, wherein the column driver IC further comprises a pulse width control circuit configured to control a pulse width of the first control voltage using a control code output from a timing controller.

15. The image processing system of claim 14, wherein the timing controller compares previous line data in display data with current line data in the display data and generates the control code according to a comparison result.

16. The image processing system of claim 15, further comprising a serial interface connected between the column driver IC and the timing controller,
wherein the timing controller is configured to generate a data packet having the display data and the control code and to transmit the generated data packet to the column driver IC through the serial interface.

* * * * *